(12) United States Patent
Evans et al.

(10) Patent No.: US 8,787,099 B2
(45) Date of Patent: Jul. 22, 2014

(54) ADJUSTING ACCESS TIMES TO MEMORY CELLS BASED ON CHARACTERIZED WORD-LINE DELAY AND GATE DELAY

(75) Inventors: Donald Albert Evans, Carroll, OH (US); Rasoju Veerabadra Chary, Karnataka (IN); Bijan Kumar Ghosh, Karnataka (IN); Richard John Stephani, Saint Paul, MN (US); Christopher David Sonnek, Centerville, MN (US)

(73) Assignee: LSI Corporation, San Jose, CA (US)

( * ) Notice: Subject to any disclaimer, the term of this patent is extended or adjusted under 35 U.S.C. 154(b) by 243 days.

(21) Appl. No.: 13/527,743

(22) Filed: Jun. 20, 2012

(65) Prior Publication Data

US 2013/0343139 A1    Dec. 26, 2013

(51) Int. Cl.
*G11C 7/00* (2006.01)
(52) U.S. Cl.
USPC ............... 365/194; 365/233.1; 365/185.23; 365/189.07
(58) Field of Classification Search
USPC ............ 365/194, 233.1, 185.23, 189.07
See application file for complete search history.

(56) References Cited

U.S. PATENT DOCUMENTS

| | | | |
|---|---|---|---|
| 4,223,396 A * | 9/1980 | Kinoshita | 365/194 |
| 4,460,980 A * | 7/1984 | Hagiwara et al. | 365/184 |
| 5,221,867 A | 6/1993 | Mitra et al. | |
| 5,414,663 A | 5/1995 | Komarek et al. | |
| 5,581,203 A | 12/1996 | Komarek et al. | |
| 5,650,979 A | 7/1997 | Komarek et al. | |
| 5,793,698 A | 8/1998 | Komarek et al. | |
| 5,886,929 A | 3/1999 | Becker et al. | |
| 5,907,517 A | 5/1999 | Komarek et al. | |
| 5,936,905 A | 8/1999 | Proebsting | |
| 6,292,015 B1 | 9/2001 | Ooishi et al. | |
| 6,947,339 B2 | 9/2005 | Lee et al. | |
| 7,111,185 B2 | 9/2006 | Gomm et al. | |
| 7,859,920 B2 | 12/2010 | Jung et al. | |
| 7,882,407 B2 | 2/2011 | Abu-Rahma et al. | |
| 2001/0052792 A1 | 12/2001 | Ooishi et al. | |
| 2003/0038653 A1 | 2/2003 | Ooishi et al. | |
| 2004/0246812 A1 | 12/2004 | Bhavnagarwala et al. | |
| 2006/0265622 A1 | 11/2006 | Gomm et al. | |
| 2008/0028255 A1 | 1/2008 | Dawson et al. | |
| 2013/0155758 A1 | 6/2013 | Liu et al. | |

FOREIGN PATENT DOCUMENTS

| | | |
|---|---|---|
| WO | WO 9605655 A1 | 2/1996 |
| WO | WO2009114286 A1 | 9/2009 |

\* cited by examiner

*Primary Examiner* — Tuan T Nguyen
(74) *Attorney, Agent, or Firm* — Mendelsohn, Drucker & Dunleavy, P.C.; Craig M. Brown; Steve Mendelsohn (57) ABSTRACT

A memory tracking circuit activates a reset signal that resets a word-line pulse generator to switch the memory from an access state to a recess state. Activation is based on (i) a signal received at the far end of a tracking row after a propagation delay and (ii) a signal applied to a transistor-based gate delay. If the memory is in a fast PVT condition such that the gate delay is of less duration than, or substantially equal to, the propagation delay, then a slow-down circuit delays activation of the reset signal to allow sufficient access margin. The delay in the latter case is less than that in the former case. If the memory is in a slow PVT condition such that the gate delay is longer than the propagation delay, then the slow-down circuit does not delay activation of the reset signal to prevent excess access margin.

14 Claims, 8 Drawing Sheets

ADJUSTING ACCESS TIMES TO MEMORY CELLS BASED ON CHARACTERIZED WORD-LINE DELAY AND GATE DELAY

SUMMARY

One embodiment of the present invention is an integrated circuit having a memory device. The memory device comprises a memory array of memory cells arranged in rows and columns, a word-line pulse generator configured to generate a word-line pulse for the memory array, and a timing circuit. The timing circuit is configured to control duration of the word-line pulse applied to a row of the memory array based on a comparison of a word-line delay and a gate delay.

Another embodiment of the present invention is a method for operating a memory device comprising (i) a memory array of cells arranged in rows and columns and (ii) a word-line pulse generator configured to generate a word-line pulse for the memory array. The method comprises (a) comparing a word-line delay and a gate delay, and (b) controlling duration of the word-line pulse applied to a row of the memory array based on the comparison.

BRIEF DESCRIPTION OF THE DRAWINGS

Other embodiments of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
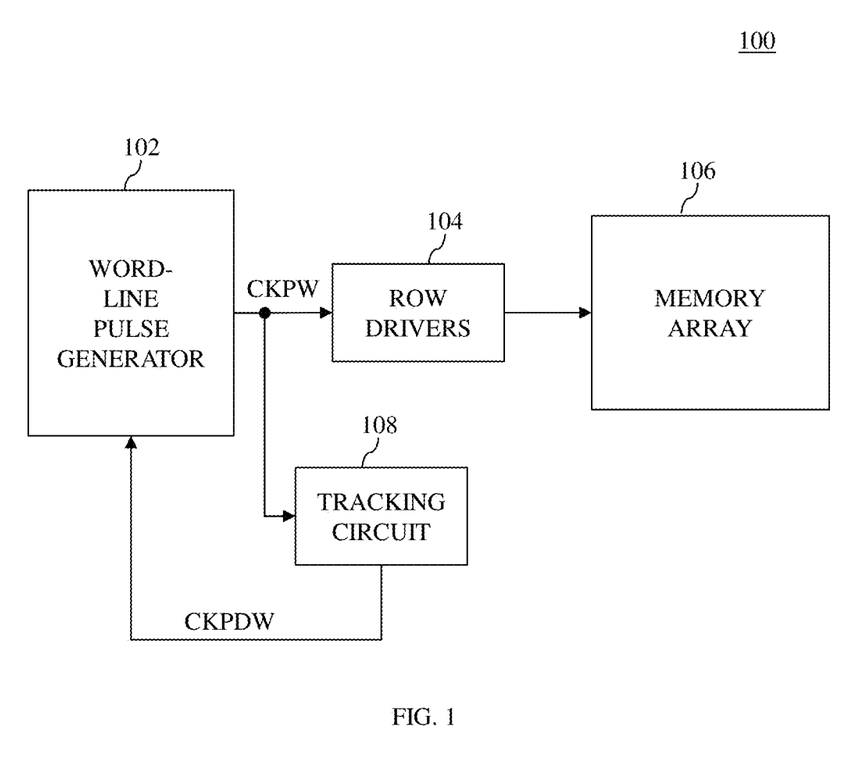
FIG. 1 shows a simplified block diagram of a memory chip according to one embodiment of the disclosure.

FIG. 1 shows a simplified block diagram of a memory chip 100 according to one embodiment of the disclosure. Memory chip 100 has memory array 106, which may be implemented using relatively-high speed memory technologies such as static random-access memory (SRAM), content addressable memory (CAM), and register files. Memory array 106 stores bits of information in arrays of memory cells, where the cells are arranged in one or more columns and one or more rows. Each cell comprises a plurality of storage transistors for storing a value, one or more bits, and a plurality of access transistors for accessing (i.e., reading from and/or writing to) the cell. For example, according to one embodiment of the disclosure, memory array 106 is implemented using SRAM, where each cell stores one bit of information using four storage transistors configured to form two cross-coupled inverters, where the cell is accessed using two access transistors.

In general, access to the cells in a row of memory array 106 is controlled by a word line, which controls the state of the access transistors of each cell in that row. When conditions are being established to access (i.e., execute a read or write operation to) a row of memory array 106, word-line pulse generator 102 changes the state of a clock-pulse signal CKPW by asserting the clock-pulse signal CKPW to switch from a logic low state to a logic high state. Based on the state of the clock-pulse signal CKPW, driver 104 drives the word line of the row of memory array 106 such that the access transistors connect each cell in the row to one or more bit lines for reading a value, one or more bits, stored in the cell or writing a value to be stored to the cell. Note that, as used herein, the terms "assert", "asserts", "asserted", and "is asserted" refer to signals whose voltages are driven high, and the terms "de-assert","de-asserts", "de-asserted" and "is de-asserted" refer to signals whose voltages are driven low. It will be understood that, in alternative (e.g., logic low) implementations, these definitions would be reversed.

The width and height of the pulse, defining the duration of time and a logic high state or a logic low state, applied to the word line are critical to the proper operation of the cells across the row. On the one hand, if the word-line pulse is not of sufficient duration of time and state to allow transistors at the far end of the word line to reach and maintain the threshold voltage level of the access transistors before the pulse reverts to its initial state, then the access transistors in one or more cells at the far end of the row will not activate. As a result, bits of information cannot be reliably written to or read from those cells. On the other hand, if the word-line pulse duration is greater than needed to write data to and/or read data from cells at the far end of the word line, then the performance of memory chip 100 will be unnecessarily slow. Note that, for this specification, word lines are described as being driven from one end toward the other. However, it is understood that word lines can be driven from other locations, such as from the center toward two opposing ends.

To ensure suitable functionality of the cells and speed of memory chip 100, termination of read and/or write operations is controlled by tracking circuit 108. Tracking circuit 108, which is discussed in further detail below, is configured with dummy memory elements such as dummy rows (also known as tracking rows) and dummy columns (also known as tracking columns) that are used as a reference for the timing characteristics of memory array 106. For instance, a tracking row may be used to characterize how much time is required for the far end of a word line of a tracking row of memory array 106 to reach the threshold voltage [magnitude] level of the access transistors to activate the access transistors after a word-line pulse is applied to a near end of the row. Each memory row is assumed to have the same timing characteristics as the tracking row. Similar circuitry is used to determine timing characteristics of a tracking column and each column of the memory array is assumed to have the same timing characteristics as the tracking column. Note that memory chips may have multiple memory arrays, and each memory array may have its own one or more tracking rows and one or more tracking columns.

In general, tracking circuit 108 receives the clock-pulse signal CKPW, and controls the state of a reset signal CKPDW that is provided to word-line pulse generator 102. When word-line pulse generator 102 assets clock-pulse signal CKPW to initiate an access state (i.e., execute a read and/or write operation), the reset signal CKPDW is initially in a low state (i.e., de-asserted). Tracking circuit 108 determines when to assert the reset signal CKPDW based on the timing characteristics of the tracking row and a gate delay (discussed in further detail below). As long as reset signal CKPDW is de-asserted, word-line pulse generator 102 is inhibited from terminating the access state and placing memory array 106 back into a recess state. The length of time between assertion of the clock-pulse signal and assertion of the reset signal CKPDW is selected by tracking circuit 108 to have minimal, if any, adverse impact on (i) the functionality of the cells in each row and (ii) the speed of the memory.

The speed of integrated circuitry, and consequently, the duration of the clock-pulse signal CKPW, tend to vary with variations in process, voltage, and temperature (PVT). In fast PVT conditions, the collective gate delays of (i) the circuitry used to implement clock-pulse generator 102 and (ii) the circuitry used to implement tracking circuit 108 shorten. As used herein, the term "individual gate delay" refers to the delay between (i) the time that an input to a logic gate of a transistor transitions to a different state and (ii) the time that the output of the logic gate transitions to a different state. Further, the term "collective gate delay" refers to the sum of a plurality of individual gate delays corresponding to a plurality of transistors connected in series.

As a result of these shortened delays in fast PVT conditions, the duration of the clock-pulse signal CKPW would shrink without the use of tracking circuit 108. However, tracking circuit 108 balances the competing needs of ensuring reliable reading and/or writing in fast PVT conditions, while at the same time, ensuring sufficient chip speed in slow PVT conditions. In particular, tracking circuit 108 (i) extends the clock-pulse duration in fast PVT conditions to extend the access time thereby ensuring reliable reading and/or writing, and (ii) does not extend the clock-pulse duration in slow PVT conditions to prevent access times from growing unnecessarily long.

Figure 2:
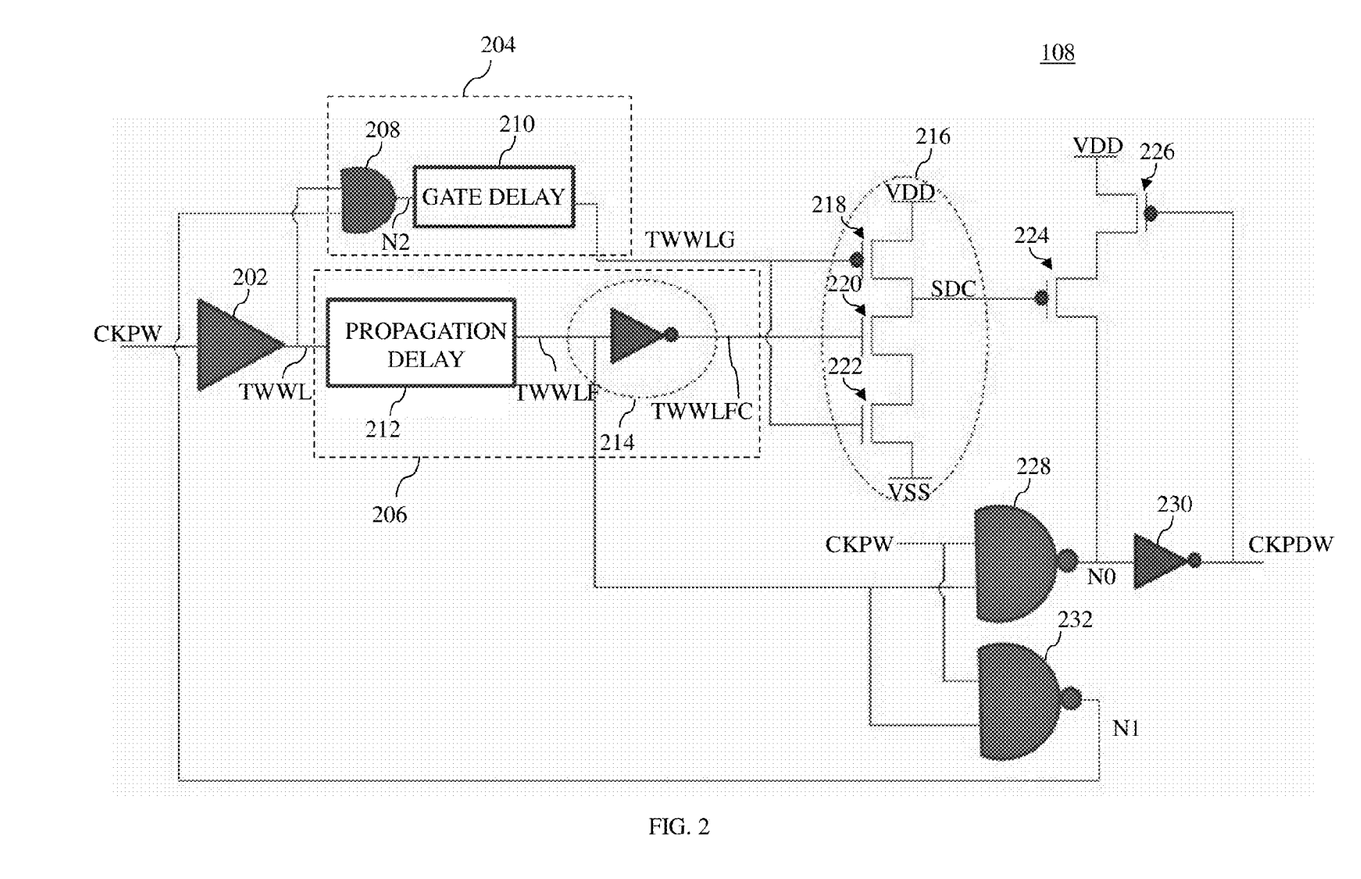
FIG. 2 shows a schematic diagram of the tracking circuit of FIG. 1 according to one embodiment of the disclosure.

FIG. 2 shows a schematic diagram of tracking circuit 108 according to one embodiment of the disclosure. For ease of discussion, tracking circuit 108 is described relative to its use in controlling write-access time. However, tracking circuits of the disclosure are not so limited. According to various embodiments, tracking circuits of the disclosure may be implemented to control write-access times, read-access times, or both write- and read-access times.

In general, when clock-pulse signal CKPW is asserted, a race begins between an upper path 204 corresponding to gate delay (discussed further below) and a lower path 206 corresponding to a propagation delay across the tracking row caused by the resistive-capacitive (RC) characteristics of the tracking row. This race determines when tracking circuit 108 will assert reset signal CKPDW to reset word-line pulse generator 102.

When the race begins, one of three scenarios can occur. In the first scenario, upper path 204 is faster than lower path 206, indicating that the gate delay is of less duration than the propagation delay across the tracking row (i.e., a fast PVT condition). In this first scenario, a slow-down circuit 216 prolongs the amount of time that reset signal CKPDW is low, thereby extending the write time to the memory cells.

In the second scenario, the speed of upper path 204 is approximately the same as the speed of lower path 206, indicating that the gate delay and propagation delay across the tracking row are approximately equal. In this second scenario, slow-down circuit 216 again prolongs the amount of time that reset signal CKPDW is low. However, the slow-down period is of less duration than the slow-down period of the first scenario.

In the third scenario, upper path 204 is slower than lower path 206, indicating that the gate delay is longer than the propagation delay across the tracking row (i.e., a slow PVT condition). In this third scenario, slow-down circuit 216 does not prolong the amount of time that reset signal CKPDW is low. As a result, the amount of time that reset signal CKPDW is low is determined based on the propagation delay across the tracking row. To further understand the operation of tracking circuit 108 in these three scenarios, consider FIG. 3, FIG. 4, and FIG. 5.

Figure 3:
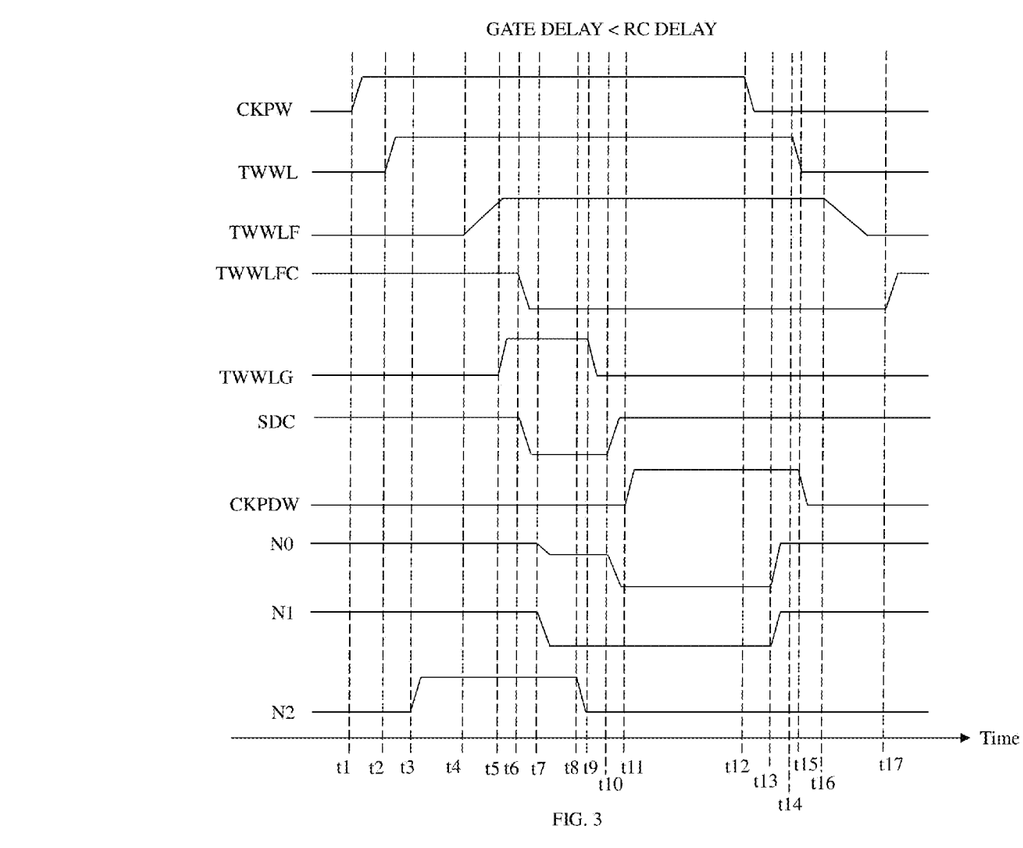
FIG. 3 shows a timing diagram of the tracking circuit of FIG. 2 when the gate delay is of less duration than the propagation delay across the tracking row.

FIG. 3 shows a timing diagram of tracking circuit 108 for the first scenario when the gate delay is of less duration than the propagation delay across the tracking row (i.e., a fast PVT condition). As shown, the race begins at time t1, when the word-line pulse generator asserts clock-pulse signal CKPW. Tracking-row driver 202 drives the near end of the tracking row based on the asserted clock-pulse signal CKPW such that tracking-row driver 202 asserts the signal TWWL at the near end of the tracking row at time t2.

On lower path 206, the signal TWWL at the near end of the tracking row propagates to the far end of the tracking row. After a propagation delay 212 caused by the RC characteristics of the tracking row, the RC-delayed signal TWWLF at the far end of the tracking row is asserted at time t4. The asserted RC-delayed signal TWWLF is inverted by inverter 214 to de-assert inverted RC-delayed signal TWWLFC at time t6. The de-asserted, inverted RC-delayed signal TWWLFC is provided to n-type field-effect transistor (NFET) 220 of slow-down circuit 216.

On upper path 204, after driver 202 asserts the near end of the tracking row (i.e., time t2) and before time t3, the signal TWWL at the upper input of AND gate 208 and the signal N1 at the lower input of AND gate 208 are both asserted. As a result, at time t3, AND gate 208 asserts signal N2, which is provided to tracking-gate circuitry comprising one or more series-connected gate-delay devices 210 (e.g., transistors and/or inverters) that generate an individual or collective transistor-based gate delay. After gate-delay devices 210, the gate-delayed signal TWWLG signal asserts at time t5 and is provided to p-type field-effect transistor (PFET) 218 and NFET 222 of slow-down circuit 216.

Since, in this first scenario, the gate delay is of less duration than the propagation delay across the tracking row, the gate-delayed signal TWWLG is asserted (i.e., at time t5) before the inverted RC-delayed signal TWWLFC is de-asserted (i.e., at time t6). As a result, the gate-delayed delayed TWWLG signal turns on slow-down circuit 216 causing the assertion of reset signal CKPDW to be delayed. In particular, at time t5, gate-delayed signal TWWLG is asserted such that PFET 218 opens (i.e., turns off) and NFET 222 closes (i.e., turns on), and inverted RC-delayed signal TWWLFC is asserted such that NFET 220 is closed (i.e., turned on). As a result of this configuration of transistors, slow-down circuit 216 de-asserts the slow-down signal SDC at time t6 (i.e., SDC is pulled downward toward VSS).

At the same time (i.e., t6) that slow-down circuit 216 de-asserts the slow-down signal SDC, signal TWWLF at the lower input of NAND gate 228 and CKPW at the upper input of NAND gate 228 are both asserted. As a result, NAND gate 228 de-asserts output N0 at time t7. However, the de-assertion of output N0 is restricted by PFET 224 and PFET 226. In particular, at time t6, when slow-down circuit de-asserts slow-down signal SDC, PFET 224 turns on. Further, at time t6, reset signal CKPDW is de-asserted such that PFET 226 is turned on. As a result, signal N0 is pulled upward toward VDD. However, the upward pull of VDD is larger than the downward pull of NAND gate 228. Thus, as shown, signal N0 is partially de-asserted between time t7 and time t10. This places tracking circuit 108 into a slow-down state, where inverter 230 is prevented from asserting reset signal CKPDW (and consequently, the word-line pulse generator is prevented from being reset).

Note that, by the time that the RC-delayed signal TWWLFC is de-asserted, indicating that the RC-delayed signal has caught up to the gate-delayed signal, slow-down circuit 216 and PFETs 224 and 226 are inhibiting tracking circuit 108 from asserting CKPDW. Until the gate-delayed signal TWWLG is de-asserted, slow-down circuit 216 and PFETs 224 and 226 fight to prevent CKPDW from being asserted.

The end of the slow-down state is controlled by NAND gate 232 and AND gate 208. In particular, at time t7, the clock-pulse signal CKPW at the upper input of NAND gate 232 and the RC-delayed signal TWWLF at the lower input of NAND gate 232 are asserted. As a result, NAND gate 232 de-asserts output N1. De-asserting output signal N1 causes AND gate 208, which also receives asserted signal TWWL, to de-assert signal N2 at time t8. De-asserting signal N2 causes gate-delayed signal TWWLG to de-assert at time t9. De-asserting TWWLG causes PFET 218 of slow-down circuit 216 to turn on and NFET 222 of slow-down circuit 216 to turn off. As a result, slow-down circuit asserts slow-down signal SDC at time t10 (i.e., SDC is pulled upward toward VDD), thereby shutting off slow-down circuit 216.

After slow-down circuit 216 is shut off at time t10, reset signal CKPDW is permitted to be asserted so that the word-line pulse generator may be reset. In particular, once slow-down circuit 216 is shut off, PFET 224 turns off such that NAND gate 228 is not fighting against the upward pull toward VDD. As a result, NAND gate 228 fully de-asserts signal N0 at time t10 and inverter 230 inverts signal N0 to assert the reset signal CKPDW at time t11.

Between time t11 and time t12, there is a brief delay where the asserted reset signal CKPDW travels back and resets the word-line pulse generator. Upon being reset, the clock-pulse signal CKPW is de-asserted at time t12, placing the memory back into a recess state. From times t12 to t17, signals TWWL, TWWLF, TWWLFC, CKPDW, N0, and N1 in tracking circuit 108 return to their initial state prior to time t1. In particular, the de-asserted clock-pulse signal CKPW causes tracking row driver 202 to de-assert signal TWWL at time t14, which in turn de-asserts RC-delayed signal TWWLF at time t16, which in turn causes inverter 214 to assert inverted RC-delayed signal TWWLFC at time t17. Additionally, the de-asserted clock-pulse signal CKPW causes NAND gate 228 and NAND gate 232 to assert signals N0 and N1, respectively, at time t13. The assertion of signal N0, then causes inverter 230 to de-assert the reset signal CKPDW at time t15.

Figure 4:
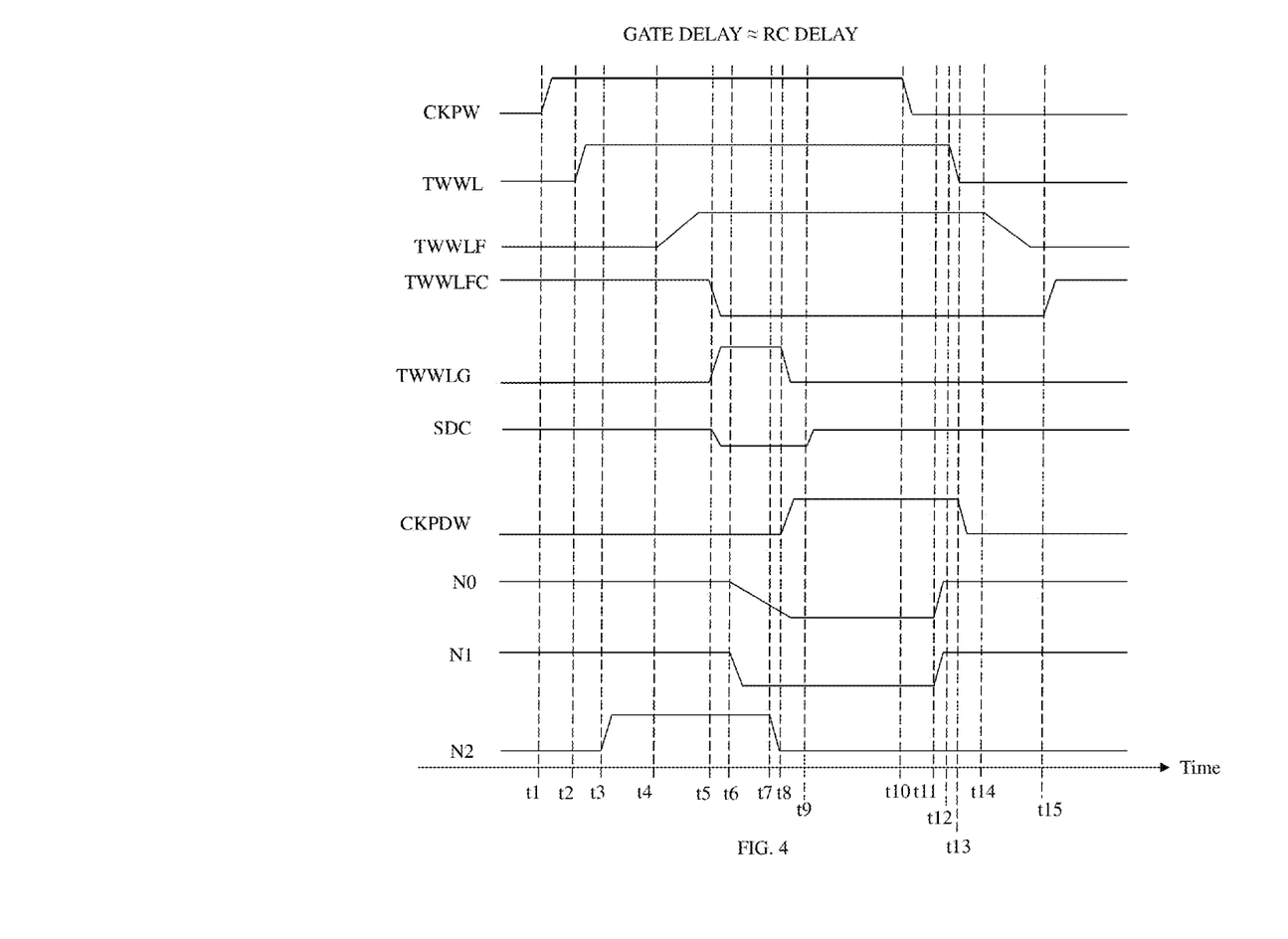
FIG. 4 shows a timing diagram of the tracking circuit of FIG. 2 when the gate delay is substantially equal to the propagation delay across the tracking row.

FIG. 4 shows a schematic diagram of tracking circuit 108 for the second scenario when the gate delay is substantially equal to the propagation delay across the tracking row. Again, as described above, the race between upper path 204 and lower path 206 begins when the word-line pulse generator asserts clock-pulse signal CKPW (i.e., at time t1). Prior to time t5, tracking circuit 108 operates in the same manner as it does in the first scenario described above. However, at time t5, the gate-delayed signal TWWLG is asserted at substantially the same time that inverter 214 de-asserts the inverted RC-delay signal TWWLFC, indicating that the gate delay is substantially equal to the propagation delay across the tracking row.

The asserted gate-delayed signal TWWLG and the de-asserted RC-delay signal TWWLFC cause slow-down circuit 216 to de-assert slow-down signal SDC at time t5. However, slow-down signal SDC becomes only partially de-asserted after time t5 (as indicated by the smaller drop of signal SDC in FIG. 4). The partially de-asserted slow-down signal SDC causes the upward pull of VDD through PFET 224 to be less than it would be if slow-down signal SDC were fully de-asserted.

At time t6, the clock-pulse signal CKPW at the upper input of NAND gate 228 and the TWWLF signal at the lower input of NAND gate 228 are both asserted. As a result, NAND gate 228 attempts to de-assert signal N0. However, the upward pull of VDD slows down the de-assertion of signal N0, such that signal N0 is de-asserted over an extended period of time from time t6 to between time t8 and t9. At time t8, before signal N0 is fully de-asserted, inverter 230 inverts signal N0 to assert the reset signal CKPDW.

Similar to the end of the slow-down state in the first scenario, the shutting off of slow-down circuit 216 is controlled by NAND gate 232 and AND gate 208. In particular, at time t6, the clock-pulse signal CKPW at the upper input of NAND gate 232 and the RC-delayed signal TWWLF at the lower input of NAND gate 232 are both asserted. As a result, NAND gate 232 de-asserts output N1. De-asserting output signal N1 causes AND gate 208, which also receives asserted signal TWWL, to de-assert signal N2 at time t7. De-asserting signal N2 causes gate-delayed signal TWWLG to de-assert at time t8. De-asserting TWWLG causes slow-down circuit 216 to assert slow-down signal SDC at time t9, thereby shutting off slow-down circuit 216.

After slow-down signal SDC and reset signal CKPDW are asserted, signals TWWL, TWWLF, TWWLFC, CKPDW, N0, and N1 of tracking circuit 108 are returned, from times t10 to t15, to their initial state prior to time t1 in a manner similar to that described above in relation to times t12 to t17 in the first scenario.

Figure 5:
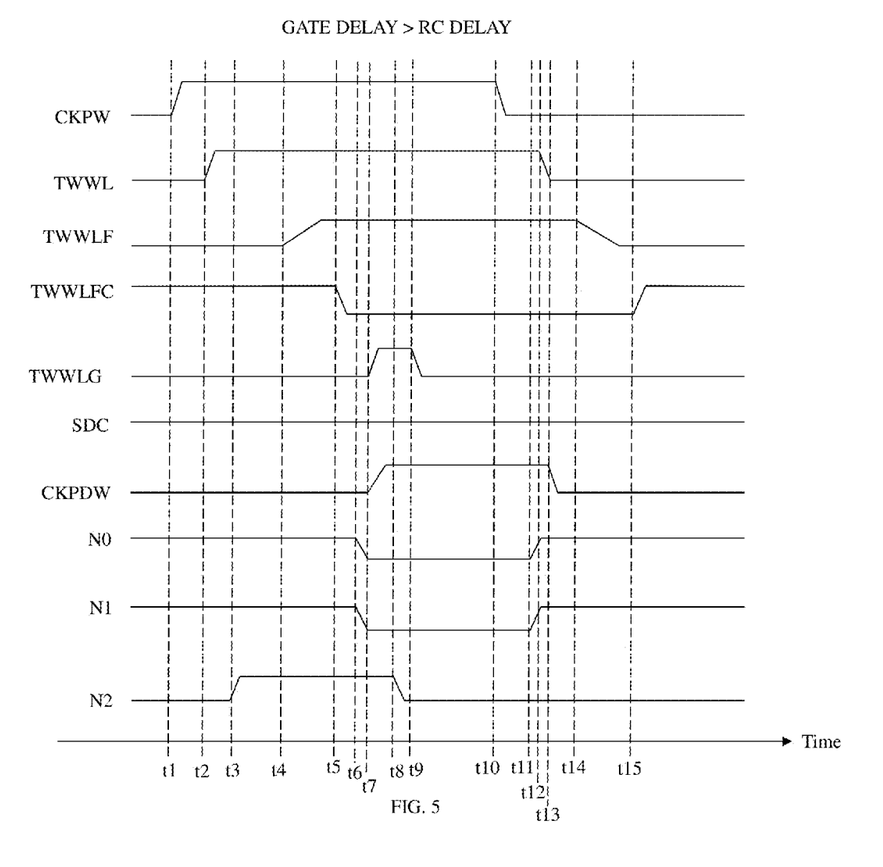
FIG. 5 shows a timing diagram of the tracking circuit of FIG. 2 when the gate delay is longer than the propagation delay across the tracking row.

FIG. 5 shows a schematic diagram of tracking circuit 108 for the third scenario when the gate delay is longer than the propagation delay across the tracking row (i.e., a slow PVT condition). Yet again, the race between upper path 204 and lower path 206 begins when the word-line pulse generator asserts clock-pulse signal CKPW (i.e., at time t1). Prior to time t5, tracking circuit 108 operates in the same manner as it does in the first scenario described above. However, at time t5, inverter 214 de-asserts the inverted RC-delay signal TWWLFC, prior to the asserting of the gate-delayed signal TWWLG at time t7, indicating that the gate delay is slower than the propagation delay across the tracking row.

Just after time t5, the inverted RC-delay signal TWWLFC and the gate-delayed signal TWWLG are both de-asserted causing NFET 220 of slow-down circuit 216 to be turned off, PFET 218 of slow-down circuit 216 to remain on, and NFET 222 of slow-down circuit 216 to remain off. As a result, slow-down circuit 216 remains off and the slow-down signal SDC remains asserted (i.e., pulled upward toward VDD).

Since the slow-down signal SDC is asserted, PFET 224 is turned off, and as a result signal, N0 is not pulled upward toward VDD by PFET 224. Further, since signal N0 is not pulled upward by PFET 224, tracking circuit 108 is not inhibited from moving forward (i.e., there is no slowdown). In other words, signal N0 is permitted to be de-asserted without being restricted by an upward pull so that reset signal CKPDW may be asserted to reset the word-line pulse generator. Thus, in this scenario, the de-assertion of signal N0, and consequently the assertion of CKPDW, is controlled based on the inputs to NAND gate 228, without restriction from slow-down circuit 216.

Just after time t5, clock-pulse signal CKPW at the upper input of NAND gate 228 and TWWLF at the lower input of NAND gate 228 are both asserted. As a result, NAND gate 228 de-asserts signal N0 at time t6, and inverter 230 inverts signal N0 to assert reset signal CKPDW at time t7. Note that signal N0 is fully de-asserted in a shorter period of time than in the first and second scenarios. This permits reset signal CKPDW to be asserted without delay (i.e., without the slow-down). The word-line pulse generator is reset after time t7 based on reset signal CKPDW, and as a result, clock-pulse signal CKPW is de-asserted at time t10 returning the memory to a recess state.

At time t7, in addition to the reset signal CKPDW being asserted, the gate-delayed signal TWWLG is also asserted, indicating that the gate-delayed signal TWWLG has caught up to the RC-delayed signal TWWLFC. However, the output of slow-down circuit 216 remains asserted because NFET 220 is turned off. As a result, there is no pull-down path in the slow-down circuit, and the slow-down signal SDC does not change. Thus, even after the gate-delayed signal TWWLG catches up to the RC-delayed signal TWWLFC, slow-down circuit 216 does not inhibit tracking circuit 108 from moving forward.

After the clock-pulse signal CKPW is de-asserted at time t10, signals TWWL, TWWLF, TWWLFC, CKPDW, N0, and N1 of tracking circuit 108 are returned, from times t10 to t15, to their initial state prior to time t1 in a manner similar to that described above in relation to times t12 to t17 in the first scenario.

Figure 6A:
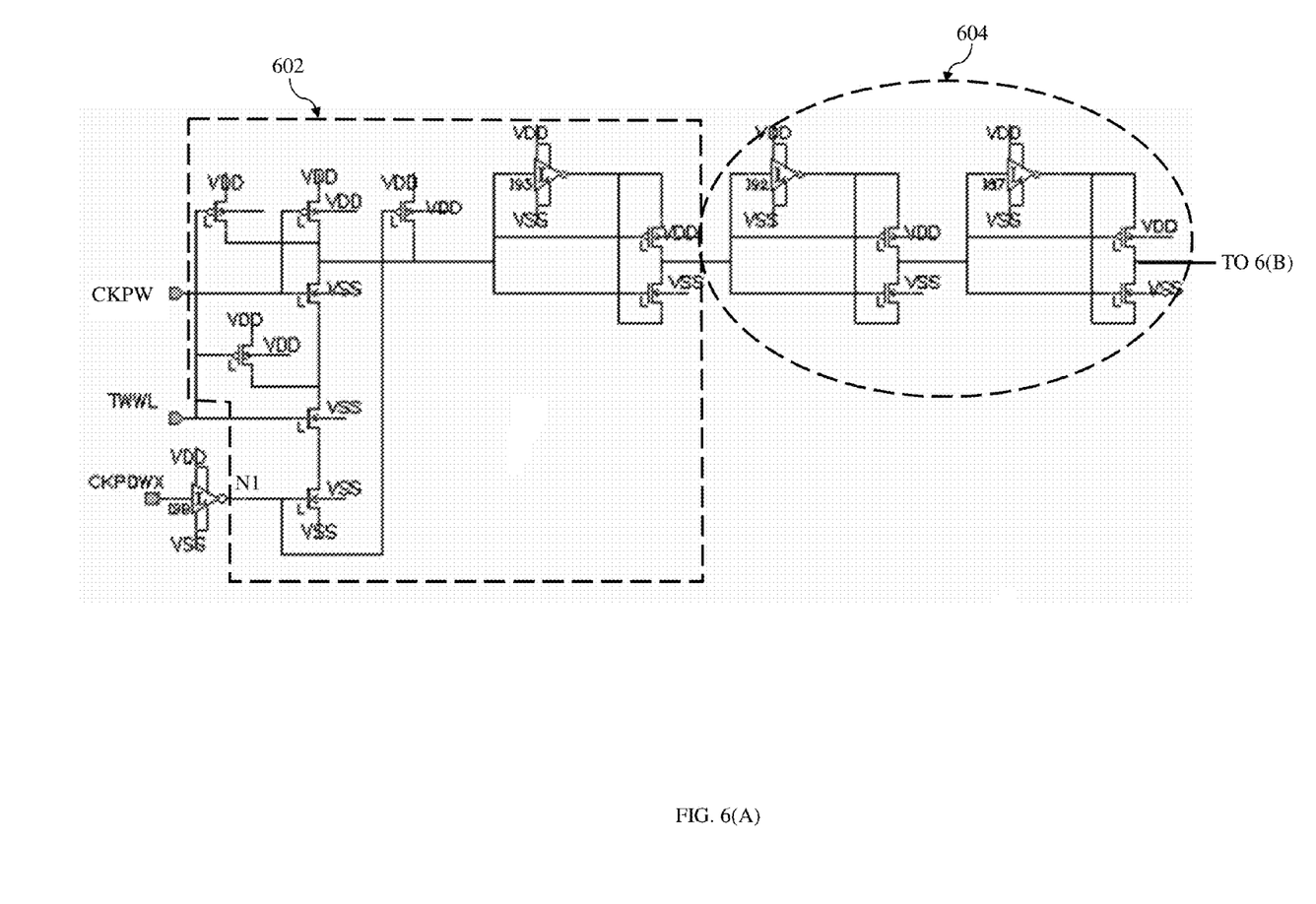
FIGS. 6(A) and 6(B) show an exemplary circuit implementation of the tracking circuit of FIG. 2 according to one embodiment of the disclosure.
Figure 6B:
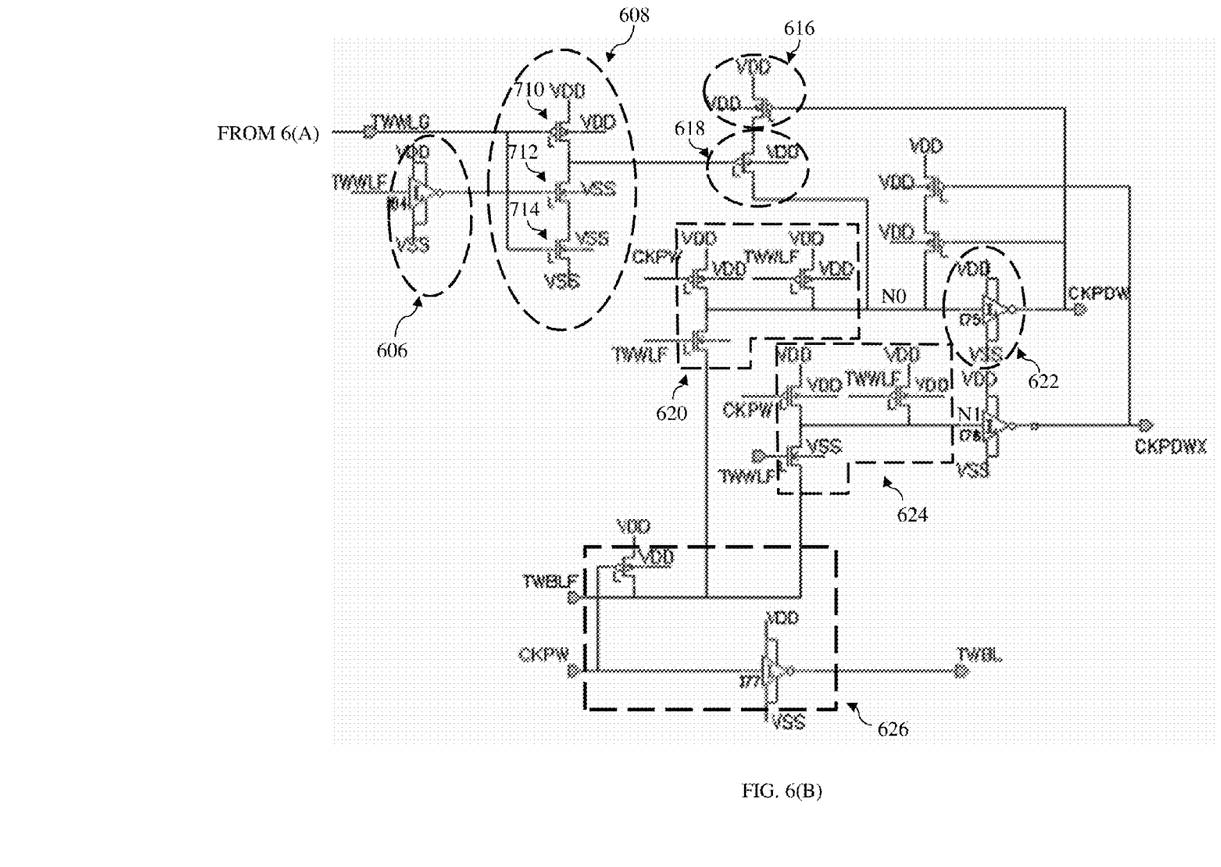

FIGS. 6(A) and 6(B) show an exemplary circuit implementation of tracking circuit 108 of FIG. 2 according to one embodiment of the disclosure. FIG. 6(A) shows an implementation of upper path 204 according to one embodiment, where the components in box 602 correspond to AND gate 208 of FIG. 2, and the components in box 604 correspond to transistors used to introduce gate delay 210. Note that one of the transistors in box 602 receives clock-pulse signal CKPW. This transistor is implemented to help the circuit recover quicker after the reset signal CKPDW is activated.

FIG. 6(B) shows one implementation of the remaining components of tracking circuitry 108 according to one embodiment. In particular, circle 606 shows an inverter that implements inverter 214. Circle 608 shows a slow-down circuit that implements slow-down circuit 216, where PFET 610, NFET 612, and NFET 614 correspond to PFET 218, NFET 220, and NFET 222, respectively. Circles 618 and 616 show PFETs that implement PFET 224 and PFET 226, respectively. Circle 622 shows an inverter that implements inverter 230. Boxes 620 and 624 implement NAND gates 228 and 232, respectively, along with box 626, which is shared between boxes 620 and 624.

Figure 7:
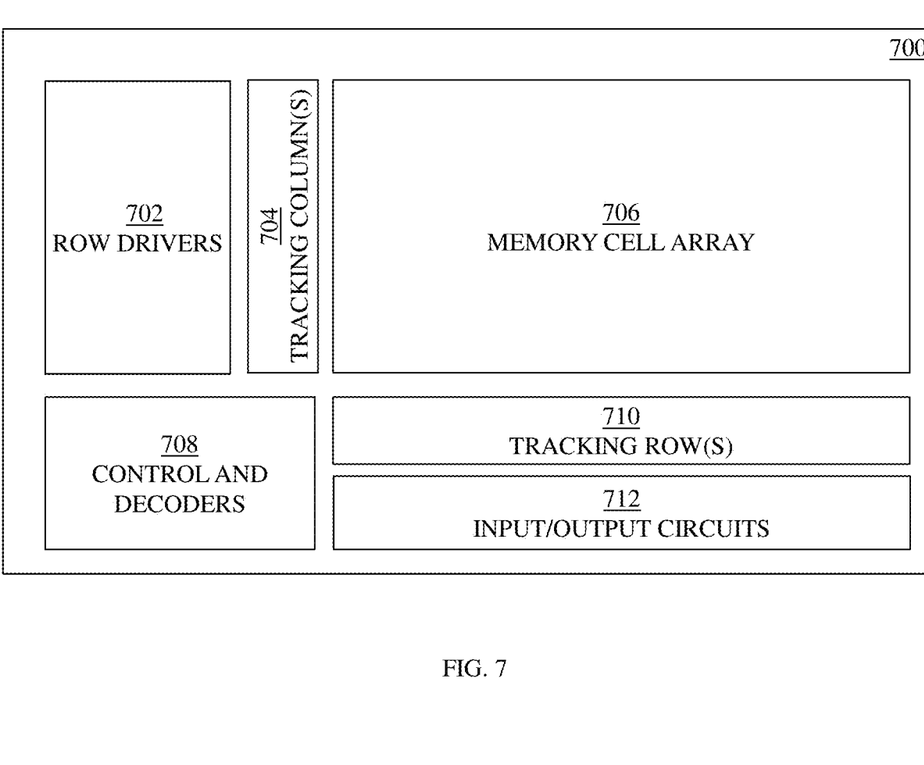
FIG. 7 shows a high-level block diagram of a memory chip according to one embodiment of the disclosure.

FIG. 7 shows a high-level block diagram of a memory chip 700 according to one embodiment of the disclosure. Memory chip 700 has memory cell array 706, tracking column(s) 704, row drivers 702, controls and decoders 708, tracking row(s) 710, and input/output (I/O) circuits 712. Memory cell array 706 is an array of memory cells organized in rows and columns, where each memory cell can be mapped to a specific address and input/output (I/O) location.

Tracking column(s) 704 comprises one or more additional memory cell columns that are used to track the bit-line loading and RC effects of memory cell array 706. Tracking row(s) 710 comprises one or more additional memory cell rows that are used to track the word-line loading and RC effects of the memory cell array. Control and decoders 708 comprise circuits such as the word-line pulse generator, address and control latches, pre-decoder drivers, and much of the self-timed control path (e.g., most of tracking circuit 108 with the exception of the propagation delay 212 across the tracking row).

Row drivers 702 complete the row address decode and drive the word lines of the memory array. For a given read or write operation, only one row is activated at a time. IO circuits 712 comprise data input latches, column multiplexers, write drivers, read sense amplifiers, and output drivers.

According to various embodiments, timing circuits of the disclosure balance the competing needs of ensuring reliable reading and/or writing in fast PVT conditions, while at the same time, ensuring sufficient chip speed in slow PVT conditions. For example, timing circuit 108 in FIG. 2 and the timing circuit in FIG. 6 extend the clock-pulse duration (i.e., delay the resetting of the word-line pulse generator) in fast PVT conditions to extend the access time thereby ensuring reliable reading and/or writing. However, in slow PVT conditions, timing circuit 108 in FIG. 2 and the timing circuit in FIG. 6 do not extend the clock-pulse duration (i.e., do not delay the resetting of the word-line pulse generator) and therefore prevent access times from growing unnecessarily long.

In addition, timing circuits of the disclosure self-adjust for different memory array configurations. For instance, timing circuit 108 in FIG. 2 and the timing circuit in FIG. 6 adjust access times to account for longer and shorter word lines.

It will be further understood that various changes in the details, materials, and arrangements of the parts which are described and illustrated in order to explain embodiments of the invention may be made by those skilled in the art without departing from the scope of the following claims. For example, PFETs 224 and 226 could be implemented such that they are stronger than NAND gate 228. As a result, when tracking circuit 108 is in a slow-down state, NAND gate 228 would not be permitted to proceed until PFET 224 is turned off.

While the exemplary embodiments of the disclosure have been described with respect to processes of circuits, including possible implementation as a single integrated circuit, a multi-chip module, a single card, or a multi-card circuit pack, embodiments of the invention are not so limited. As would be apparent to one skilled in the art, various functions of circuit elements may also be implemented as processing blocks in a software program. Such software may be employed in, for example, a digital signal processor, micro-controller, or general purpose computer.

Embodiments of the invention can take the form of methods and apparatuses for practicing those methods. Embodiments of the invention can also take the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. Embodiments of the invention can also take the form of program code, for example, stored in a non-transitory machine-readable storage medium including being loaded into and/or executed by a machine, wherein, when the program code is loaded into and executed by a machine, such as a computer, the machine becomes an apparatus for practicing an embodiment of the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

what is claimed is:

1. An integrated circuit having a memory device comprising:
    a memory array of memory cells arranged in rows and columns;
    a word-line pulse generator configured to generate a word-line pulse for the memory array; and
    a timing circuit configured to control duration of the word-line pulse applied to a row of the memory array based on a comparison of a word-line delay and a gate delay.

2. The integrated circuit of claim 1, wherein the timing circuit comprises:
    a tracking word-line configured to receive the word-line pulse and output a word-line-delayed version of the word-line pulse;
    a tracking-gate circuitry configured to receive the word-line pulse and output a gate-delayed version of the word-line pulse; and
    a slow-down circuit configured to compare the word-line-delayed and gate-delayed versions of the word-line pulse to control the duration of the word-line pulse.

3. The integrated circuit of claim 2, wherein the timing circuit is adapted to generate a reset signal applied to the word-line pulse generator to control the duration of the word-line pulse, wherein the reset signal is generated based on (i) the word-line pulse, (ii) the word-line-delayed version of the word-line pulse, and (iii) an output of the slow-down circuit.

4. The integrated circuit of claim 3, wherein:
    the timing circuit comprises logic circuitry configured to generate the reset signal based on (i) the word-line pulse and (ii) the word-line delayed version of the word-line pulse; and
    the output of the slow-down circuit controls a change of the reset signal.

5. The invention of claim 4, wherein, when the gate-delayed version of the word-line pulse arrives at the slow-down circuit before the word-line-delayed version of the word-line pulse, the output of the slow-down signal prevents a change in the reset signal to extend the duration of the word-line pulse.

6. The integrated circuit of claim 4, wherein, when the word-line-delayed version of the word-line pulse arrives at the slow-down circuit before the gate-delayed version of the word-line pulse, the output of the slow-down signal does not prevent a change in the reset signal to not extend the duration of the word-line pulse.

7. The integrated circuit of claim 1, wherein the timing circuit is adapted to control the word-line pulse generator to (i) extend the duration of the word-line pulse generated by the word-line pulse generator when the gate delay is of less duration than the word-line delay, and (ii) not extend the duration of the word-line pulse generated by the word-line pulse generator when the gate delay is longer than the word-line delay.

8. A method for operating a memory device comprising (i) a memory array of cells arranged in rows and columns and (ii) a word-line pulse generator configured to generate a word-line pulse for the memory array, the method comprising:
    (a) comparing a word-line delay and a gate delay; and
    (b) controlling duration of the word-line pulse applied to a row of the memory array based on the comparison of step (a).

9. The method of claim 8, wherein:
    step (a) comprises:
    (a1) applying the word-line pulse to a tracking word-line to generate a word-line-delayed version of the word-line pulse; and
    (a2) applying the word-line pulse to a tracking-gate circuitry to generate a gate-delayed version of the word-line pulse; and
    (a3) comparing the word-line-delayed and gate-delayed versions of the word-line pulse.

10. The method of claim 9, wherein step (b) comprises generating a reset signal applied to the word-line pulse generator to control the duration of the word-line pulse, wherein the reset signal is generated based on (i) the word-line pulse and (ii) the word-line-delayed version of the word-line pulse.

11. The method of claim 10, wherein step (b) further comprises controlling a change of the reset signal based on the comparison of step (a3).

12. The method of claim 11, wherein controlling a change of the reset signal in step (b) comprises preventing a change in the reset signal to extend the duration of the word-line pulse when the gate-delayed version of the word-line pulse is faster than the word-line-delayed version of the word-line pulse.

13. The method of claim 11, wherein controlling a change of the reset signal in step (b) comprises not preventing a change in the reset signal to not extend the duration of the word-line pulse when the word-line-delayed version of the word-line pulse is faster than the gate-delayed version of the word-line pulse.

14. The method of claim 8, wherein the step (b) comprises:
(bi) extending the duration of the word-line pulse generated by the word-line pulse generator when the gate delay is of less duration than the word-line delay; and
(bii) not extending the duration of the word-line pulse generated by the word-line pulse generator when the gate delay is longer than the word-line delay.

\* \* \* \* \*